United States Patent
Gillingham

(10) Patent No.: US 8,836,148 B2
(45) Date of Patent: Sep. 16, 2014

(54) INTERPOSER FOR STACKED SEMICONDUCTOR DEVICES

(71) Applicant: Mosaid Technologies Incorporated, Ottawa (CA)

(72) Inventor: Peter Gillingham, Ottawa (CA)

(73) Assignee: Conversant Intellectual Property Management Inc. (CA)

( * ) Notice: Subject to any disclaimer, the term of this patent is extended or adjusted under 35 U.S.C. 154(b) by 0 days.

(21) Appl. No.: 13/687,198

(22) Filed: Nov. 28, 2012

(65) Prior Publication Data

US 2013/0134607 A1    May 30, 2013

Related U.S. Application Data

(60) Provisional application No. 61/564,623, filed on Nov. 29, 2011.

(51) Int. Cl.
| | | |
|---|---|---|
| H01L 23/48 | (2006.01) | |
| H01L 23/52 | (2006.01) | |
| H01L 29/40 | (2006.01) | |
| H01L 25/065 | (2006.01) | |
| H01L 23/13 | (2006.01) | |
| H01L 23/31 | (2006.01) | |
| H01L 23/498 | (2006.01) | |

(52) U.S. Cl.
CPC ....... *H01L 23/52* (2013.01); *H01L 2224/48227* (2013.01); *H01L 2224/4824* (2013.01); *H01L 2225/06575* (2013.01); *H01L 2224/48091* (2013.01); *H01L 2924/15311* (2013.01); *H01L 2224/73215* (2013.01); *H01L 2225/06572* (2013.01); *H01L 25/0657* (2013.01); *H01L 2924/19107* (2013.01); *H01L 2924/10253* (2013.01); *H01L 2224/73265* (2013.01); *H01L 23/13* (2013.01); *H01L 2224/32145* (2013.01); *H01L 2924/3011* (2013.01); *H01L 2225/0651* (2013.01); *H01L 2224/32225* (2013.01); *H01L 23/3128* (2013.01); *H01L 23/49838* (2013.01)

USPC .......... 257/782; 257/666; 257/686; 438/107; 438/125

(58) Field of Classification Search
USPC .......... 257/668, 686, 782, 737, 777; 438/107, 438/109, 125
See application file for complete search history.

(56) References Cited

U.S. PATENT DOCUMENTS

| | | | |
|---|---|---|---|
| 8,174,116 B2 | 5/2012 | Masuda et al. | |
| 2004/0080027 A1* | 4/2004 | Grigg et al. | 257/667 |
| 2007/0278648 A1* | 12/2007 | Akram | 257/686 |
| 2009/0121338 A1 | 5/2009 | Seng | |
| 2009/0166835 A1* | 7/2009 | Yang et al. | 257/686 |
| 2012/0043668 A1 | 2/2012 | Refai-Ahmed et al. | |
| 2012/0199960 A1 | 8/2012 | Cosue et al. | |
| 2012/0241925 A1* | 9/2012 | Yoon et al. | 257/666 |

* cited by examiner

*Primary Examiner* — Phuc Dang

(57) ABSTRACT

A semiconductor device is disclosed, comprising a substrate having at least one substrate bonding pad. A plurality of semiconductor dies are stacked on the substrate. Each semiconductor die has at least one die bonding pad located on an active surface of the die. A plurality of interposers are each mounted on a corresponding one of the semiconductor dies. Each interposer has an aperture formed therethrough in alignment with the at least one die bonding pad. An electrical connection between the at least one die bonding pad and the at least one substrate bonding pad is formed at least in part by the interposer. The electrical connection includes at least one wire bond.

16 Claims, 3 Drawing Sheets

INTERPOSER FOR STACKED SEMICONDUCTOR DEVICES

CROSS-REFERENCE TO RELATED APPLICATION AND CLAIM OF PRIORITY

This application claims the benefit of priority to U.S. Provisional Patent Application No. 61/564,623, filed on Nov. 29, 2011, the contents of which are hereby incorporated herein by reference in their entirety.

FIELD OF THE INVENTION

The invention relates generally to semiconductor memory devices, and more specifically to multi-chip packages.

BACKGROUND

Memory dies are commonly stacked to increase the memory density on a limited area of a substrate, for example within a standard-sized package. The resulting stacked devices are known as Multi-Chip Packages (MCP).

Referring to FIG. 1, one typical semiconductor device 100 has bonding pads 102 located around the periphery of each die 104. These dies 104 can be stacked and bonded using a simple interposer 106 to create sufficient space for a bonding wire 108 to reach one die 104 located underneath another die 104, and electrically connect the die 104 to a substrate 110.

Referring to FIG. 2, other semiconductor devices 200, such as NAND Flash, may have bonding pads 202 located along a single edge of each die 204. This eliminates the need for interposers entirely, since the dies 204 can be staggered or laterally offset from one another to expose the bonding pads 202 and allow bonding wire 208 access to each die 204 for electrical connection to a substrate 210.

However, high speed DDR DRAM devices, such as DDR3, have bonding pads located on the center spine of the die. Neither of the above techniques can be conveniently employed with such a bonding pad configuration, because the bonding pads of a lower die in the stack would be obstructed by higher dies in the stack, thereby preventing bonding wires from connecting the bonding pads to the substrate. As a result, the memory density of DRAM devices is effectively limited to the capacity of a single chip.

One approach to deal with this drawback is to connect the DRAM dies using through-silicon vias (TSVs). However, this approach requires a complex process to form the TSVs, which increases the cost of manufacture, adds manufacturing steps, and may decrease production yields. In addition, TSVs occupy area on the die, which may require redesigning the die to reconfigure the memory components, and which either increases the size or reduces the memory capacity of the die accordingly. Therefore, this method is not suitable for use with conventional DRAM dies.

Therefore, there is a need for a method of stacking DRAM dies such that all of the stacked dies can be connected to a common substrate.

There is also a need for a method of stacking semiconductor dies and bonding the dies to a common substrate, without requiring a particular bonding pad arrangement.

There is also a need for a multi-chip package having stacked DRAM dies that is simple to manufacture.

SUMMARY

It is an object of the present invention to address one or more of the disadvantages of the prior art.

It is another object of the present invention to provide a multi-chip package having stacked DRAM dies, with interposers permitting wire bonding to bonding pads in the center of each die.

It is another object of the present invention to provide a method for stacking semiconductor dies and provide electrical connections to bonding pads not located at the edge of the dies.

It is another object of the present invention to provide an interposer having an opening generally aligned with centrally located bonding pads of a semiconductor die, and electrical traces providing electrical connections between the bonding pads of the semiconductor die and bonding pads near an edge of the interposer that can be conveniently wire bonded to the substrate.

In one aspect, a semiconductor device comprises a substrate having at least one substrate bonding pad. A plurality of semiconductor dies are stacked on the substrate. Each semiconductor die has at least one die bonding pad located on an active surface of the die. A plurality of interposers are each mounted on a corresponding one of the semiconductor dies. Each interposer has an aperture formed therethrough in alignment with the at least one die bonding pad. An electrical connection is formed between the at least one die bonding pad and the at least one substrate bonding pad. The electrical connection is formed at least in part by the interposer. The electrical connection includes at least one wire bond.

In a further aspect, a plurality of spacers are each mounted on a corresponding one of the interposers.

In a further aspect, each of the plurality of spacers has an aperture formed therethrough. The aperture is generally in alignment with the aperture of the corresponding interposer.

In a further aspect, the at least one die bonding pad is a plurality of die bonding pads.

In a further aspect, the plurality of die bonding pads are located in a central region of the active surface of the semiconductor die.

In a further aspect, the plurality of die bonding pads are located along a central spine of the semiconductor die.

In a further aspect, each interposer further comprises a plurality of aperture bonding pads disposed along the aperture. Each aperture bonding pad corresponds to one of the plurality of die bonding pads.

In a further aspect, the electrical connection comprises an electrical connection between each aperture bonding pad and the corresponding die bonding pad.

In a further aspect, the electrical connection between each aperture bonding pad and the corresponding die bonding pad is a wire bond.

In a further aspect, a plurality of spacers are each mounted on a corresponding one of the interposers.

In a further aspect, each of the plurality of spacers has an aperture formed therethrough. The aperture is generally in alignment with the aperture and the aperture bonding pads of the corresponding interposer.

In a further aspect, the electrical connection further comprises a conductive trace connecting each aperture bonding pad to a corresponding one of a plurality of edge bonding pads disposed along an outer edge of the interposer.

In a further aspect, the conductive traces are formed on the interposer.

In a further aspect, the conductive traces are formed in an internal portion of the interposer.

In a further aspect, the electrical connection further comprises a wire bond between each edge bonding pad and the corresponding substrate bonding pad.

In a further aspect, the electrical connection further comprises a wire bond between each aperture bonding pad and the corresponding die bonding pad.

DETAILED DESCRIPTION

Figure 1:
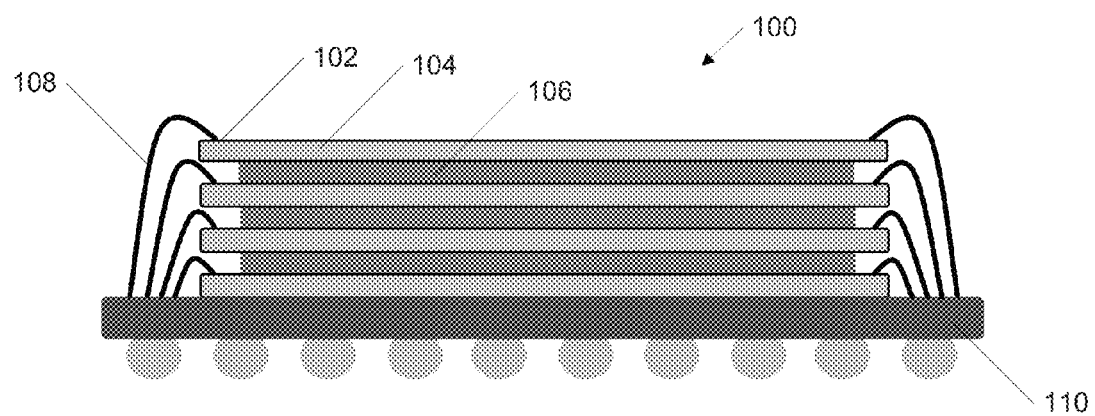
FIG. 1 is a schematic side elevation view of a Multi-Chip Package (MCP) according to a first prior art embodiment.
Figure 2:
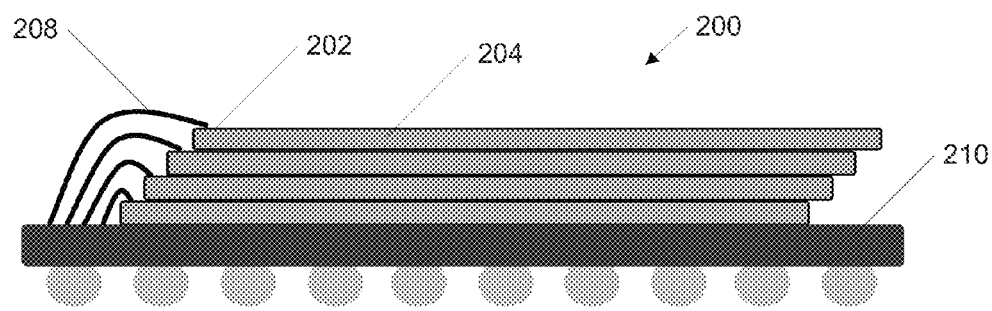
FIG. 2 is a schematic side elevation view of a Multi-Chip Package (MCP) according to a second prior art embodiment.
Figure 3A:
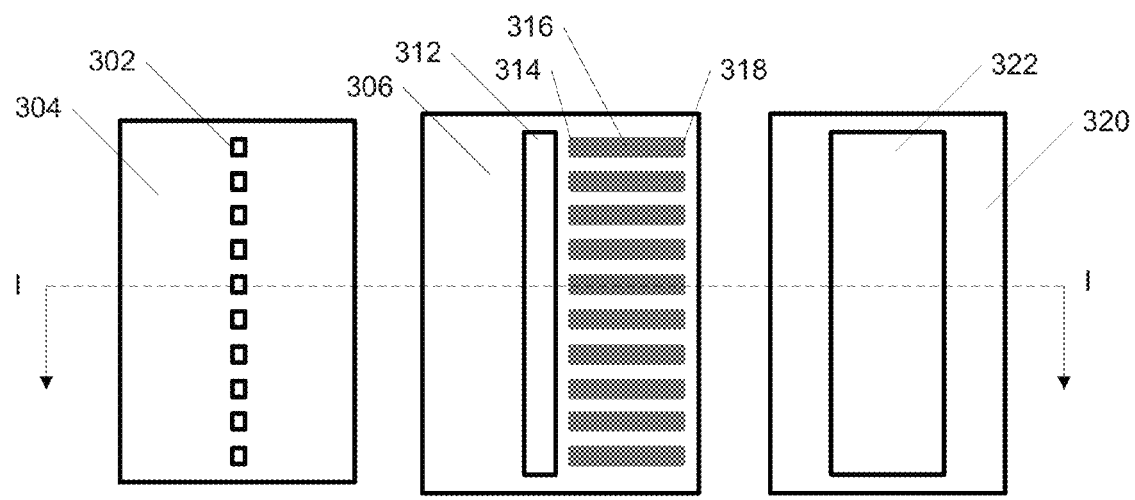
FIG. 3A is a top plan view of a semiconductor die, an interposer, and a spacer according to a first embodiment.
Figure 3B:
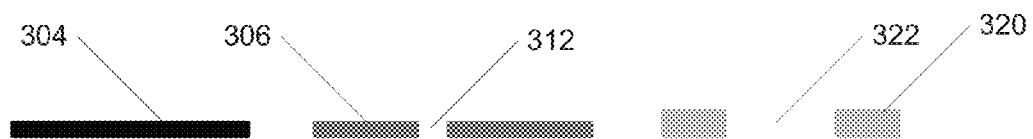
FIG. 3B is a cross-sectional view of the semiconductor die, interposer, and spacer of FIG. 3, taken along the line I-I.
Figure 4:
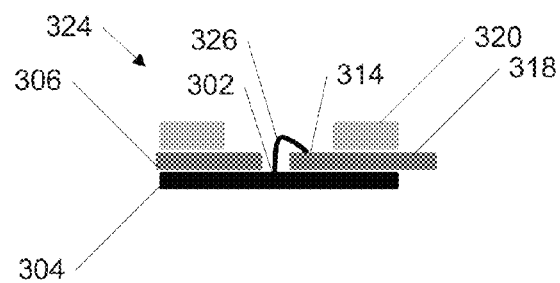
FIG. 4 is a cross-sectional elevation view of a stacked arrangement of the semiconductor die, interposer, and spacer of FIG. 3, taken along the line I-I.
Figure 5:
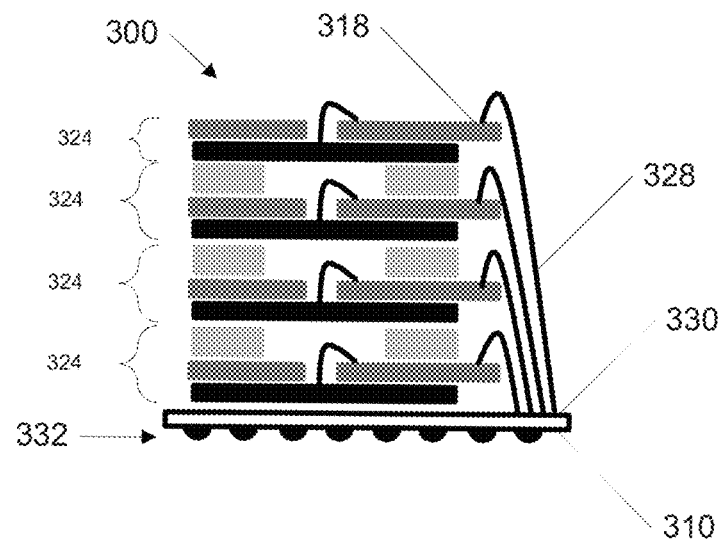
FIG. 5 is a cross-sectional elevation view of a Multi-Chip Package (MCP) according to a first embodiment.

Referring to FIGS. 3-5, a stacked die arrangement will be described according to a first embodiment. Referring to FIG. 3, a semiconductor die 304 is shown as a DRAM die, which may be a high-speed DDR, DDR2, or DDR3 die, having a number of die bonding pads 302 on the active surface of the die 304. The die bonding pads 302 permit electrical connection between the circuitry of the die 304 and external devices such as the substrate 310 (shown in FIG. 5) or another die 304. The die bonding pads 302 are located along a central spine of the die 304, which is a typical arrangement for a DRAM die. However, the present invention should be understood to be applicable to other types of semiconductor dies, which may have bonding pads located elsewhere on the central region of the active surface of the die, and therefore too far from an edge of the die to form wire bonds as shown in FIG. 2. It should also be understood that the die bonding pads 302 are shown for the purposes of illustration only, and are not intended to be representative of the number or relative size of the bonding pads on a DRAM die.

Referring still to FIG. 3, an interposer 306 has an aperture 312 formed therethrough. The aperture 312 is large enough that when the interposer 306 is stacked on top of the die 304, the die bonding pads 302 are accessible from above for wire bonding, as will be described below in further detail. A number of aperture bonding pads 314 are disposed along the aperture 312, corresponding to the number of die bonding pads 302 on the die 304. Conductive traces 316 extend from each aperture bonding pad 314 to a corresponding edge bonding pad 318 positioned along an outer edge of the interposer 306. The conductive traces 316 may be formed on a top layer of the interposer 306 or in an internal portion of the interposer 306 below the top layer, and provide an electrical connection between each aperture bonding pad 314 and its corresponding edge bonding pad 318. The interposer 306 can be made from a suitable printed circuit board material, such as FR4.

The conductive traces 316 can be formed in a single interconnect layer, with other layers optionally used for power supply distribution, shielding, or other purposes as desired. The conductive traces 316 are illustrated only schematically, and it is contemplated that they might have a more complex shape or a non-uniform width depending on the desired application. For example, the conductive traces 316 may be wider at either or both ends to provide the bonding pads 314, 318, and narrower in between to properly match transmission line impedance to the drivers and receivers communicating therethrough. The conductive traces 316 may also be arranged to concentrate signals in particular areas, rather than being evenly distributed across the interposer 306, for example to simplify the connections on the package substrate that will be described below. For example, different interposers 306 in a single stack may have a different arrangement of edge bonding pads 318 to reduce congestion in the wire bonding connections to the edge bonding pads, to group the connections for similar signals together, or to shorten overall signal paths. This may be advantageous where independent busses within the package connect to different groups of DRAM, as disclosed in U.S. patent application Ser. No. 12/967,918, "SEMICONDUCTOR MEMORY DEVICE WITH PLURAL MEMORY DIE AND CONTROLLER DIE", which is incorporated herein by reference in its entirety. It is further contemplated that more than one edge of the interposer 306 could be provided with edge bonding pads 318, in which case some of the aperture bonding pads 314 could be positioned on the opposite side of the aperture 312 for connection to the edge bonding pads 318 located on the opposite side of the interposer 306 via appropriately-positioned conductive traces 316.

Referring still to FIG. 3, a spacer 320 has an aperture 322 formed therethrough. The aperture 322 is large enough that when the spacer 320 is stacked on top of the interposer 306, the die bonding pads 302 of the die 304 and the aperture bonding pads 314 of the interposer 306 are accessible for wire bonding, or alternatively large enough to not interfere with any existing wire bonding between the die bonding pads 302 of the die 304 and the aperture bonding pads 314 of the interposer 306. The spacer 320 may be made from any suitable non-conductive material, such as FR4. Alternatively, the spacer 320 may be made from a conductive material having good thermal conductivity to allow for heat dissipation, in which case the spacer 320 may be provided with a thin insulating coating to avoid shorting the conductive traces 316 on the interposer 306. The thin insulating coating may not be needed if the conductive traces 316 are formed in an internal layer of the interposer 306 and protected by an insulating layer of the interposer 306.

Referring to FIG. 4, the die 304, the interposer 306, and the spacer 320 can optionally be stacked as a sub-assembly 324 for later assembly into a multi-chip package (MCP) 300 (FIG. 5). For this purpose, the die 304 could be a fully tested known good die, which would preferably be from a silicon wafer (not shown) that has been back ground to thin the die to 100 µm or less, preferably to 70 µm or less, so that 4 or 8 dies 304 could be assembled into a device having a total thickness of less than 1 mm. The interposer 306 is then mounted on the active surface of the die 304 such that the aperture 312 is aligned with the die bonding pads 302, thereby permitting bonding wires 326 to be attached by a wire bonding machine (not shown), providing an electrical connection between each die bonding pad 302 and its corresponding aperture bonding pad 314. The edge of the interposer 306 including the edge bonding pads 318 extends beyond the edge of the die 304, so that when multiple sub-assemblies 324 are stacked to form an MCP 300 as shown in FIG. 5, the edge bonding pads 318 can be wire bonded to the substrate 310. If the interposer 306 has edge bonding pads 318 on more than one edge, the interposer 306 could be dimensioned so that each of the edges having edge bonding pads 318 will extend beyond the edge of the die 304 to permit wire bonding in the assembled MCP 300. The spacer 320 is mounted on the top surface of the interposer 306, either before or after the bonding wires 326 are attached.

The aperture 322 in the spacer 320 is generally aligned with the aperture 312 in the interposer 306, and is dimensioned to not interfere with the bonding wires 326, or with the process of forming the bonding wires 326 if the bonding wires are formed after mounting the spacer 320. The spacer 320 may have a lateral extent similar to that of the die 304, and is small enough to not obstruct the edge bonding pads 318 so that bonding wires 328 (FIG. 5) can later be attached thereto to form the MCP 300. The thickness of the spacer 320 is sufficient to provide a clearance between the bonding wires 326 and a die 304 mounted on top of the spacer 320, while still preferably being thin enough to allow for a reasonably compact assembled MCP 300.

Referring to FIG. 5, an MCP 300 can be assembled by stacking any desired number of sub-assemblies 324 on a substrate 310, for example four or eight sub-assemblies 324, and electrically connecting the edge bonding pads 318 of each sub-assembly 324 to substrate bonding pads 330 located on the substrate 310 via bonding wires 328 as the sub-assembly 324 is mounted. The sub-assembly 324 at the top of the stack may optionally not have a spacer 320, to save cost or manufacturing steps, or to reduce the overall height of the stack. Alternatively, the MCP 300 may be assembled by individually stacking each layer and wire bonding the layers at appropriate stages in the process. In this manner, a first die 304 is stacked on the substrate 310, followed by a first interposer 306 and a first spacer 320. The interposer 306 is wire bonded to the die 304 and to the substrate 310, either before or after stacking the spacer 320. A second die 304 is stacked on the first spacer 320, followed by a second interposer 306 and a second spacer 320, the second interposer 306 is wire bonded to the die 304 and to the substrate 310, and the process is repeated with additional dies 304, interposers 306, and spacers 320 until a desired stack height is reached, for example four or eight dies 304.

Alternatively, the MCP 300 may be formed using different groupings of layers as sub-assemblies, for example mounting each die 304 wire bonded with its interposer 306 as a sub-assembly, wire bonding the interposer 306 to the substrate 310, and then mounting the spacer 320 on the interposer 306 before mounting the next die 304 and interposer 306 sub-assembly on top of the spacer 320. The process can be repeated until a desired stack height is reached, such as four or eight dies 304.

Regardless of the particular method of assembling the MCP 300, it should be understood that an electrical connection is formed between each die bonding pad 302 and a corresponding substrate bonding pad 330, through the bonding wires 326, 328 and the conductive traces 316 of the interposer 306. The substrate bonding pads 330 are electrically connected to the ball grid array 332 on the opposite side of the substrate 310 via conductive traces (not shown) in the substrate 310. In this manner, each die 304 is in electrical communication with the substrate 310 to send and receive data and other signals from an external device (not shown) via the ball grid array 332 on the opposite side of the substrate 310.

Once assembled, the MCP 300 may be covered with a plastic resin or other packaging compound to protect the MCP 300 by providing mechanical support and electrically isolating the bonding wires.

Figure 6:
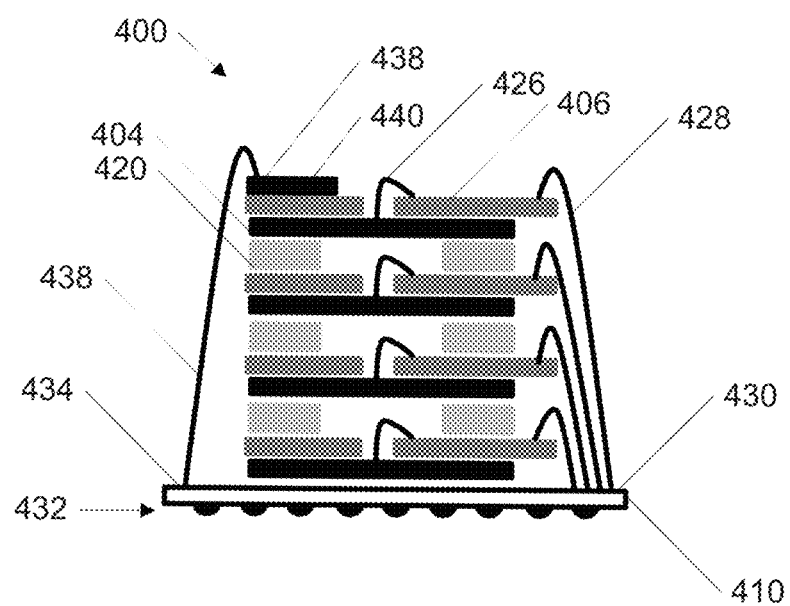
FIG. 6 is a cross-sectional elevation view of a Multi-Chip Package (MCP) according to a second embodiment.

Referring to FIG. 6, an MCP 400 consists of components similar to the MCP 300 of FIG. 5, connected in a similar way, which have been given similar reference numerals and will not be described again in detail. The MCP 400 may be assembled in a manner similar to the MCP 300 of FIG. 5, either by stacking individual semiconductor dies 404, interposers 406, and spacers 420 or by stacking sub-assemblies 424, or some suitable combination thereof, and attaching the necessary bonding wires. However, unlike the MCP 300 of FIG. 5, the semiconductor dies 404 of the MCP 400 do not connect directly to the ball grid array 432 for communication with external circuits. Instead, the substrate bonding pads 430 connect via conductive traces (not shown) in the substrate 410 to another set of substrate bonding pads 434. The substrate bonding pads 434 are connected via bonding wires 436 to corresponding bonding pads 438 on a bridge chip 440. The bridge chip 440 is additionally wire bonded or otherwise electrically connected to the substrate 410 for communication with the ball grid array 432, and provides an interface between the external circuits and the dies 404, for example as disclosed in U.S. patent application Ser. No. 12/967,918, which is incorporated by reference herein in its entirety. The bridge chip 440 is typically much smaller than the dies 404, in which case it can fit on one side of the top interposer 406, or the top spacer 420 if one is provided, without interfering with the bonding wires 426. A sufficiently large bridge chip 440 that would overlap the aperture 312 of the top interposer 406 might require a spacer 420 on mounted to the top interposer 406 to allow space for the bonding wires 426. Some advantages of interfacing via the bridge chip 440 in the MCP 400 are disclosed in U.S. patent application Ser. No. 12/967,918, and include reduced electrical loading of the external bus.

It should be understood that the structures described herein may provide a number of advantages, such as using conventional high-volume DDR dies in a single package, using conventional wire bonding instead of the more complex TSV connections, saving the additional process steps associated with TSVs, and not requiring separate master and slave dies to implement a multiple die arrangement.

Modifications and improvements to the above-described embodiments of the present invention may become apparent to those skilled in the art. The foregoing description is intended to provide examples rather than be limiting.

What is claimed is:

1. A semiconductor device comprising:
   a substrate having at least one substrate bonding pad;
   a plurality of semiconductor dies stacked on the substrate, each semiconductor die having at least one die bonding pad located on an active surface of the die;
   a plurality of interposers, each interposer being mounted on a corresponding one of the semiconductor dies, each interposer having an aperture formed therethrough in alignment with the at least one die bonding pad; and
   an electrical connection between the at least one die bonding pad and the at least one substrate bonding pad, the electrical connection being formed at least in part by the interposer, the electrical connection including at least one wire bond.

2. The semiconductor device of claim 1, further comprising:
   a plurality of spacers, each spacer being mounted on a corresponding one of the interposers.

3. The semiconductor device of claim 2, wherein each of the plurality of spacers has an aperture formed therethrough, the aperture being generally in alignment with the aperture of the corresponding interposer.

4. The semiconductor device of claim 1, wherein the at least one die bonding pad is a plurality of die bonding pads.

5. The semiconductor device of claim 4, wherein the plurality of die bonding pads are located in a central region of the active surface of the semiconductor die.

6. The semiconductor device of claim 5, wherein the plurality of die bonding pads are located along a central spine of the semiconductor die.

7. The semiconductor device of claim 4, wherein each interposer further comprises a plurality of aperture bonding pads disposed along the aperture, each aperture bonding pad corresponding to one of the plurality of die bonding pads.

8. The semiconductor device of claim 7, wherein the electrical connection comprises an electrical connection between each aperture bonding pad and the corresponding die bonding pad.

9. The semiconductor device of claim 8, wherein the electrical connection between each aperture bonding pad and the corresponding die bonding pad is a wire bond.

10. The semiconductor device of claim 9, further comprising a plurality of spacers, each spacer being mounted on a corresponding one of the interposers.

11. The semiconductor device of claim 10, wherein each of the plurality of spacers has an aperture formed therethrough, the aperture being generally in alignment with the aperture and the aperture bonding pads of the corresponding interposer.

12. The semiconductor device of claim 9, wherein the electrical connection further comprises a conductive trace connecting each aperture bonding pad to a corresponding one of a plurality of edge bonding pads disposed along an outer edge of the interposer.

13. The semiconductor device of claim 12, wherein the conductive traces are formed on the interposer.

14. The semiconductor device of claim 12, wherein the conductive traces are formed in an internal portion of the interposer.

15. The semiconductor device of claim 12, wherein the electrical connection further comprises a wire bond between each edge bonding pad and the corresponding substrate bonding pad.

16. The semiconductor device of claim 15, wherein the electrical connection further comprises a wire bond between each aperture bonding pad and the corresponding die bonding pad.

* * * * *